(12) United States Patent
Choy

(10) Patent No.: US 8,929,168 B2
(45) Date of Patent: Jan. 6, 2015

(54) SENSE AMPLIFIER VOLTAGE REGULATOR

(71) Applicant: Jon S. Choy, Austin, TX (US)

(72) Inventor: Jon S. Choy, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 129 days.

(21) Appl. No.: 13/780,969

(22) Filed: Feb. 28, 2013

(65) Prior Publication Data

US 2014/0241091 A1 Aug. 28, 2014

(51) Int. Cl.
G11C 7/00 (2006.01)
G11C 7/06 (2006.01)
G11C 5/14 (2006.01)
G11C 11/4074 (2006.01)

(52) U.S. Cl.
CPC .. *G11C 7/06* (2013.01); *G11C 5/14* (2013.01); *G11C 11/4074* (2013.01)
USPC .......... 365/207; 365/189.09; 365/226

(58) Field of Classification Search
CPC ........ G11C 5/14; G11C 7/06; G11C 11/4074; G11C 11/4091; G11C 1/5642; G11C 16/26
USPC ................ 365/207, 185.21, 189.09, 226
See application file for complete search history.

(56) References Cited

U.S. PATENT DOCUMENTS 5,363,340 A * 11/1994 Ishikawa et al. ........... 365/233.5
7,075,844 B2 * 7/2006 Pagliato et al. ............... 365/207
7,385,377 B2    6/2008 Pisasale et al.
7,548,480 B2    6/2009 Jeong
7,701,798 B2    4/2010 Lee

* cited by examiner

*Primary Examiner* — Tan T. Nguyen
(74) *Attorney, Agent, or Firm* — David G. Dolezal; Mary Jo Bertani

(57) ABSTRACT

A memory is disclosed that includes a plurality of memory cells, a plurality of sense amplifiers for reading data of the memory cells, and a voltage regulator coupled to the plurality of sense amplifiers. The voltage regulator includes a reference sense amplifier, a current injector, and a current injector control circuit. The current injector control circuit controls an amount of current provided by the current injector to an output node of the voltage regulator based on a voltage of the reference sense amplifier.

21 Claims, 6 Drawing Sheets

SENSE AMPLIFIER VOLTAGE REGULATOR

BACKGROUND OF THE INVENTION

1. Field of the Invention

This invention relates in general to memories and more specifically to a voltage regulator for a sense amplifier.

2. Description of the Related Art

Some memory circuits utilize sense amplifiers for reading the data values stored in memory cells. Data is read by a sense amplifier during a read operation. During a read operation, a high amount of transient current may be drawn by a large number of sense amplifiers operating to read data from the memory cells. This large amount of transient current may momentarily drop the voltage provided by the regulator to the sense amplifiers.

In order to prevent the voltage of a regulator output from dropping during a read operation, some regulators include current injectors for providing an additional source of current to the regulator output from a supply rail.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a voltage regular includes at least one current injector to provide a regulated voltage to sense amplifiers of a memory during a read operation. The voltage regulator includes a current injector control circuit that provides a signal to control the amount of current provided by the at least one current injector. The control circuit monitors a regulated voltage to a reference sense amplifier circuit and adjusts the control signal to regulate the regulated voltage to the reference sense amplifier at a particular value. Accordingly, the signal used to regulate the voltage provided the reference sense amplifier is used to control the amount of current provided by the at least one current injectors to the sense amplifiers during a read operation.

Figure 1:
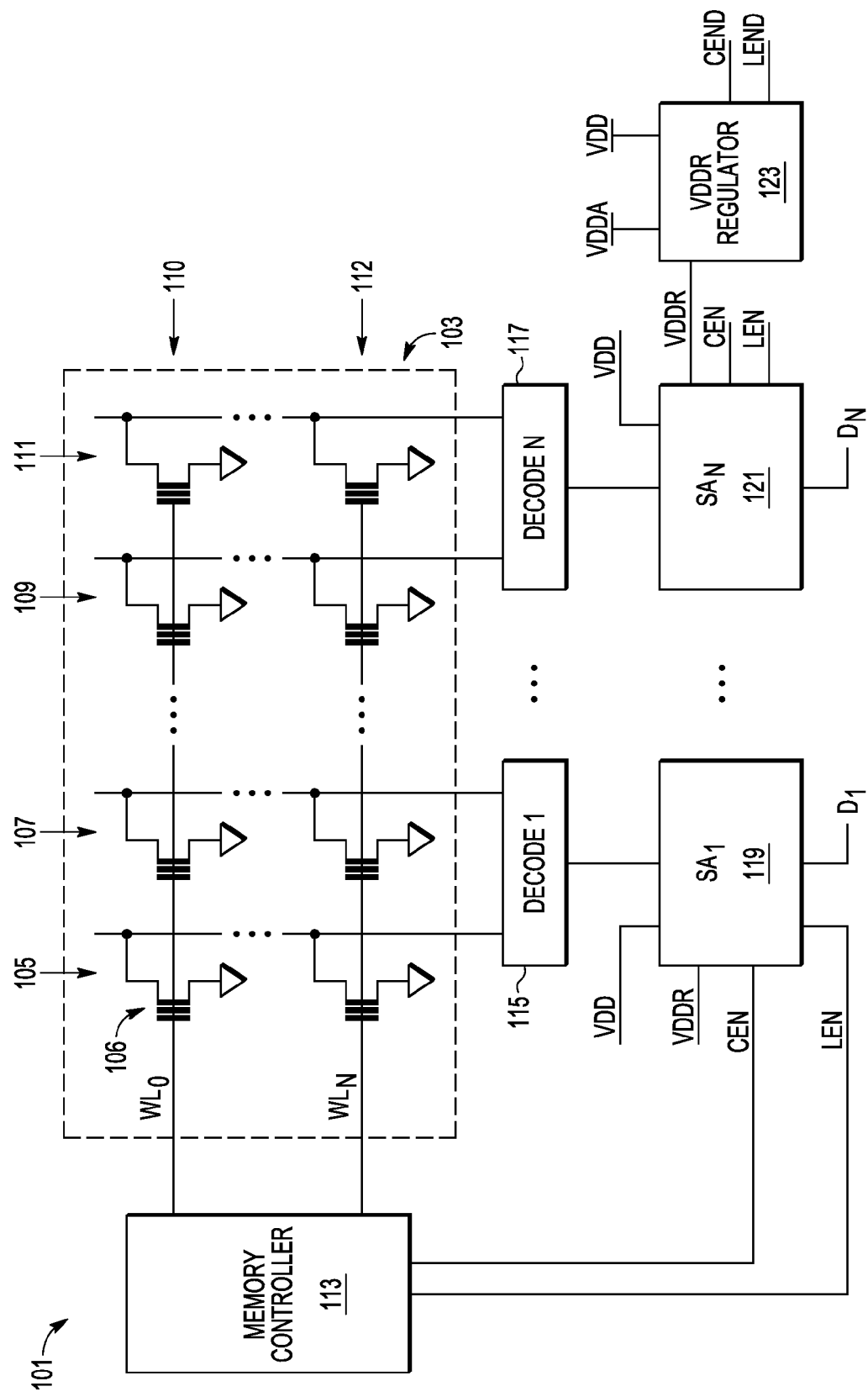
FIG. 1 is a circuit diagram of a memory according to one embodiment of the present invention.

FIG. 1 is a circuit diagram of a memory according to one embodiment of the present invention. Memory 101 includes an array 103 of memory cells for storing data that can be retrieved from the memory during a read operation. In the embodiment shown, the memory cells (e.g. memory cell 106) are non volatile memory cells that include a charge storage structure for selectively controlling the threshold voltage of a transistor of the memory cell to selectively store a particular data value. In one embodiment, the memory cells are flash memory cells where the charge storage structure is floating gate structure. However, memory 101 may include other types of memory cells including other types of non volatile memory cells (e.g. other types of EEPROM cells) or volatile memory cells (e.g. DRAM, SRAM cells) in other embodiments.

Memory 101 includes an array 103 of memory cells located in rows and columns. Each row (e.g. rows 110 and 112) is coupled to a word line (e.g. WL0) provided by a memory controller 113. The particular word line asserted during a read or write cycle depends upon an address provided to the memory on address lines (not shown) from a data interface (e.g. system bus (not shown)). Also not shown in FIG. 1 are inputs to controller 113 for receiving control, data, and clocking signals from a data interface.

In the embodiment shown, the columns of memory cells are connected to decoder circuitry that is connected sense amplifiers where a sense amplifier can be used to selectively read data from cells of multiple columns. For example, sense amplifier 119 is connected to decode circuit 115 so as to be able to read data from either column 105 or column 107. Likewise, sense amplifier 121 is connected to decode circuit 117 to be able to read data from column 109 or column 111. The control signals (not shown) for the decode circuits are provided by the memory controller 113. Some embodiments do not include decode circuits. Although FIG. 1 includes two rows and four columns of memory cells, other embodiments may include a greater number of rows and/or columns. Also, other embodiments may include a greater number of sense amplifiers.

Each sense amplifier receives control signals from memory controller 113, with a cascode enable signal (CEN) and a latch enable signal (LEN) shown in FIG. 1. Other signals (not shown) may also be provided to the sense amplifiers, e.g. such as a precharge signal. Each sense amplifier also receives regulated supply voltages VDD and VDDR. VDDR is provided by VDDR voltage regulator 123. VDD may be provided by a regulator (not shown). Each sense amplifier includes a data output (e.g. D1, DN) for providing the value of the data being read during a read operation.

Memory 101 may have other components not shown in FIG. 1. Also, other memories may have other configurations. In one embodiment, the memory is located on a single integrated circuit, which may include processing circuitry as well. In other embodiments, the memory may be implemented with multiple integrated circuits.

Figure 2:
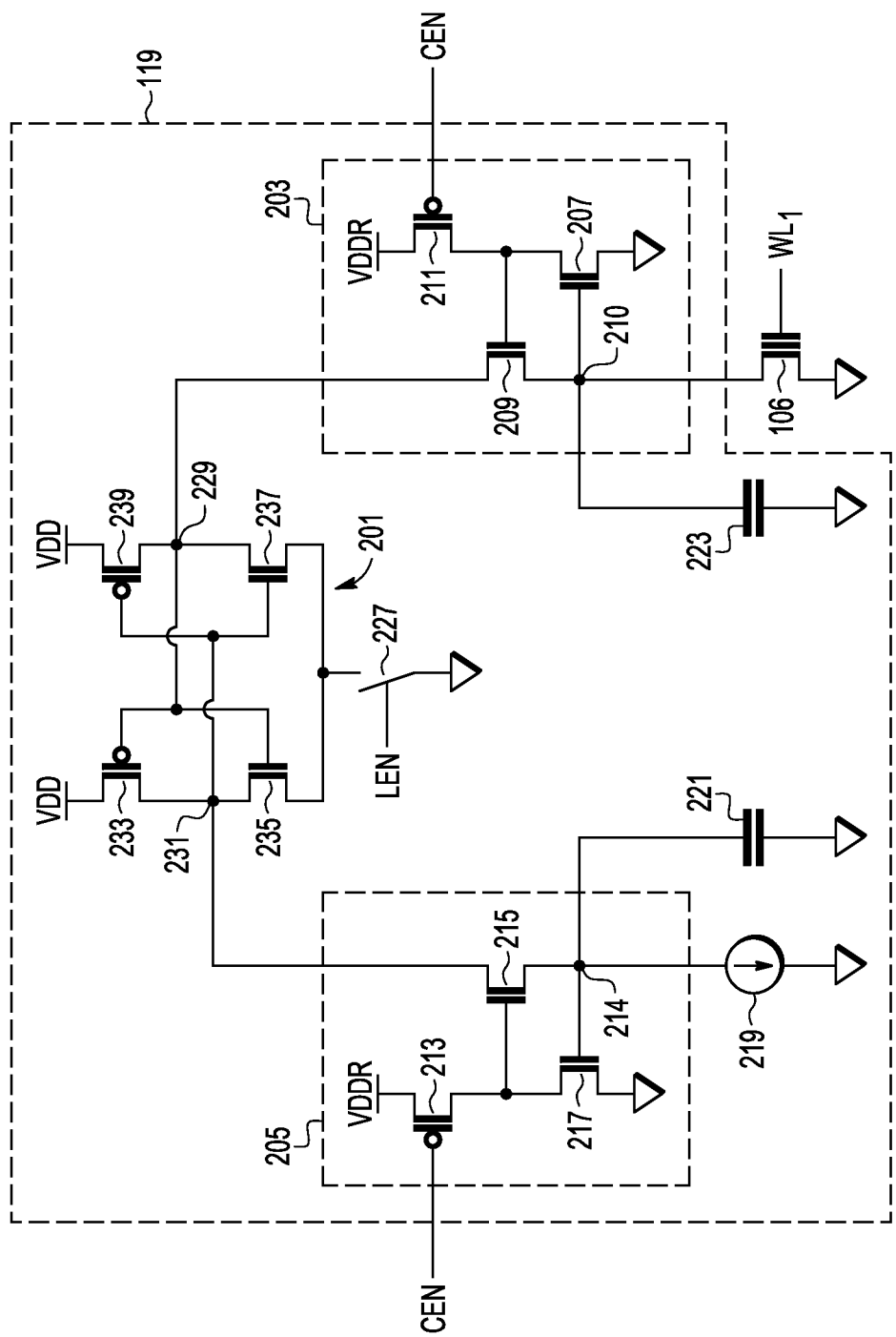
FIG. 2 is a circuit diagram of a sense amplifier according to one embodiment of the present invention.

FIG. 2 is a circuit diagram of a sense amplifier according to one embodiment of the present invention. In the embodiment shown, sense amplifier 119 includes a latch 201 with P-MOS transistors 233 and 239 and NMOS transistor 235 and 237 configured in a cross coupled configuration. The sources of transistors 233 and 239 are connected to a regulated supply voltage VDD. The sources of transistors 235 and 237 are connected to switch 227, whose conductivity is controlled by the LEN signal. The data value being read is latched at latched nodes 231 and 229.

In the embodiment shown, sense amplifier 119 includes regulated cascode circuits 205 and 203 that are connected to latched nodes 231 and 229 respectively. Regulated cascode circuit 203 is used to bias the drain of the memory cell being read (cell 106 in FIG. 2) at a value to ensure that the drain-source voltage of the memory cell is above a particular value (e.g. 0.5 V in some embodiments). In FIG. 1, cell 106 is shown as being read, but other cells may be read by sense amplifier 119 in other read operations. In the embodiment shown, cascode circuit 203 also reduces the effect of the parasitic capacitance (represented by capacitor symbol 223) from latched node 229 so as to allow latch 201 to switch faster.

Casode circuit 203 includes transistors 209, 207, and 211. The gate of transistor 211 is controlled by the CEN signal to selectively enable cascode circuit 203 during a read operation. Transistors 209 and 207 are arranged in a feedback configuration such that the voltage of node 210 is regulated at a particular value (e.g. the threshold voltage of transistor 207) when the CEN signal is asserted. During a read operation, the CEN signal (which is an active low signal) is asserted to a low voltage to make transistor 211 provide a load for transistor 207 which acts to raise the voltage of the gate of transistor 209 to make transistor 209 conductive. Transistor 209 being conductive raises the voltage of node 210 which makes transistor 207 more conductive to lower the voltage of the gate of transistor 209, which makes transistor 209 less conductive to lower the voltage of node 210. Thus, the feedback configuration of transistors 209 and 207 regulates the voltage of node 210 at a particular value.

Cascode circuit 205 includes transistors 213, 215, and 217. Cascode circuit 205 works in a similar way (as cascode circuit 203) to regulate the voltage of node 214, which is connected to a terminal of current source 219, at a particular value (e.g. 0.5V in some embodiments). In the embodiment shown, cascode circuit 205 also reduces the effect of the parasitic capacitance (represented by capacitor symbol 221) from latched node 231 so as to allow latch 201 to switch faster.

In some embodiments, during a read operation, the voltage levels of latched nodes 229 and 231 are dependent upon whether charge is stored in the memory cell being read (e.g. cell 106) to raise the threshold voltage of the memory cell transistor. If the threshold voltage is raised above the asserted voltage of a word line (WL1), then the transistor of the memory cell will not conduct and the voltage of node 229 will be higher than the voltage of node 231. Latch 201 will latch the difference in voltages between the latched nodes. If (due to a selective lack of stored charge) the threshold voltage is below the asserted voltage of a word line, then the memory cell will conduct and pull the voltage of node 229 below the voltage of node 231. The data out signal produced by a sense amplifier (not shown) is dependent upon the voltage of latched nodes 231 and 229. In one embodiment, the data out line is coupled to one of the latched nodes. A sense amplifier may have different configurations and/or may operate in different ways in other embodiments. For example, the circuitry and operation of a sense amplifier may depend on the type of memory cells being read (e.g. non volatile, SRAM, DRAM).

In the embodiment shown, the cascode circuits are supplied with a supply voltage VDDR from regulator 123 and the sources of the latch transistor 233 and 239 are supplied from a different voltage regulator VDD (not shown). However, in other embodiments, the sources of latch transistors 233 and 239 can be supplied from regulator 123 as well.

Figure 3:
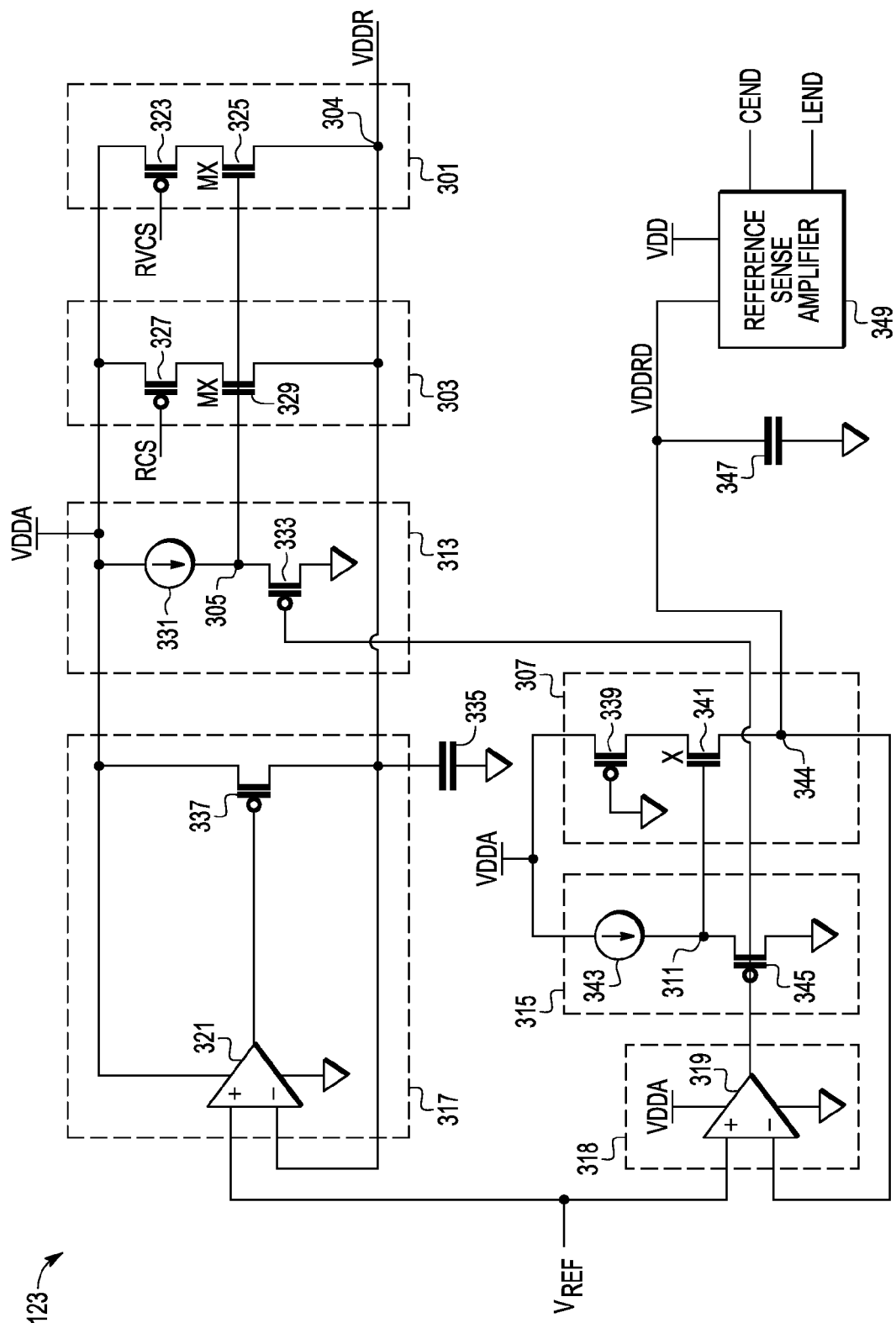
FIG. 3 is a circuit diagram of a voltage regulator according to one embodiment of the present invention.

FIG. 3 is a circuit diagram of one embodiment of a voltage regulator. Regulator 123 includes a regulator output node 304 to supply a regulated voltage (VDDR). In some embodiments, the regulator output node 304 is coupled to multiple sense amplifiers (e.g. 119) of memory 101.

Regulator 123 includes an error regulator circuit 317 that is used to control the voltage of the regulator output node 304 at a value that corresponds to Vref. Circuit 317 includes amplifier 321 having an output connected to transistor 337. The inverting input of amplifier 321 is connected to output node 304 and the non inverting input is connected to Vref. The output node 304 is also connected to capacitor 335, which supplies current for the output node 304 during a change in output current to assist in maintaining the voltage of output node 304 at a regulated level.

During operation, the output of amplifier 321 is provided at a voltage to control the conductivity of transistor 337 to make the voltage of node 304 match the reference voltage Vref. However, because of the large number of sense amplifiers coupled to node 304, transient current from the read and read verify write cycles would cause the voltage of node 304 to fall below the regulated voltage due to error regulator circuit's 321 inability to respond quickly enough to the transient current.

To prevent the voltage of node 304 from falling below the regulated voltage level during memory reads, regulator 123 includes two current injectors to provide current to node 304 during those reads. A current injector is a circuit that when enabled, couples a power supply rail (e.g. VDDA) to the output of a regulator (e.g. node 304) in order to provide a controllable amount of current to the output of the regulator from the power supply rail. In the embodiment shown, current injectors 301 and 303 include control terminals (the gates of transistors 325 and 329, respectively) whose voltage controls the amount of current that is provided by the injector.

Current injector 303 is enabled during a read cycle. Current injector 301 is enabled during a read verify cycle. In one embodiment, memory 101 is capable of performing simultaneous read cycles and read verify write cycles. Each injector 303 and 301 is selectively enabled by a control signal RCS and RVCS, respectively, that is asserted during the read operation for which the VDDR voltage is desired. The RCS signal is asserted during a read cycle and the RVCS is asserted during a read verify write cycle. During simultaneous operation of both a read cycle and read verify cycle, twice as many sense amplifiers would be enabled (and would be providing transient current). Thus, during simultaneous operation, both current injectors are enabled to provide current.

In other embodiments, a regulator may include a different number of current injectors. In some embodiments, a first set of multiple injectors could be enabled during a read cycle and a second set of multiple injectors could be enabled during a read verify cycle. In such embodiments, each injector of a set is located in parallel and receives either the RCS signal or the RVCS signal (depending on which set the injector belongs). In other embodiments, regulator 123 would include only one current injector. One single injector embodiment would be enabled during both read and read verify write cycles. In other embodiments, the memory would not be able to perform simultaneous read and read verify write cycles.

Regular 123 includes a current injector control circuit 318 for controlling the amount of current provided by the current injectors 301 and 303 when enabled. In the embodiment shown, current injector control circuit 318 is implemented with amplifier 319 whose non inverting input is connected to Vref and whose inverting input is connected to a supplied voltage node VDDRD 344 that is connected a reference sense amplifier 349. Node 344 is connected to capacitor 347. However, other embodiments may include other types of current injector control circuits for providing a signal to control the amount of current provided by a current injector.

Regulator 123 includes a reference sense amplifier 349. A reference sense amplifier is a circuit that has similar components to a sense amplifier to provide similar operating characteristics of a sense amplifier, but does not retrieve usable data stored in a memory. In one embodiment, reference sense amplifier 349 is continuously cycled during normal operation of memory 101. Continuously cycled means that the reference sense amplifier is continuously operated to simulate a read cycle at periodic intervals. Continuously cycling the reference sense amplifier 349 causes the amplifier 349 to continually generate transient current that is similar to what a sense amplifier (e.g. 119) generates during a read operation.

Reference sense amplifier 349 receives a regulated voltage (VDDRD) from output node 344 of regulator 123. Node 344 is connected to a current injector 307 that is used to supply current to node 344 as controlled by the output of amplifier 319. Current injector includes transistor 339 and transistor 341, whose gate controls the amount of current provided by injector 307.

Amplifier 319 provides a voltage at its output that causes current injector 307 to provide an appropriate amount of current to accommodate for the transient current generated from the continuously cycled reference sense amplifier 349 so that the voltage of node 344 matches the voltage of Vref. If the voltage of node 344 falls due to the transient current, amplifier 319 adjusts the voltage of its output to increase the amount of current provided by current injector 307 to raise the voltage of node 344 back to match Vref.

In the embodiment shown, the current potential of each of injectors 303 and 301 are at a multiple (M) greater than the current potential of injector 307. In one embodiment, the value of M is the number of sense amplifiers coupled to node 304 during a particular read cycle or a read verify write cycle. In one embodiment, the current potential of an injector is based on the width of the transistor whose gate (e.g. transistor 329) is controlled to control the amount of current provided by the injector. In other embodiments, a current injector may have multiple such transistors (e.g. transistor 329) located in parallel and connected to the same control signal to provide for the increased current potential of a current injector. Still in other embodiments, a regulator may have multiple injectors located in parallel and connected to the same control signal wherein the combined current potential of the multiple injectors equals the desired amount.

As stated above, control circuit 318, which is implemented with amplifier 319, also controls the amount of current provided by injectors 303 and 301. Hence, in the embodiment shown, by controlling its output voltage so that current injector 307 provides the appropriate amount of current to accommodate for the transient current generated by the reference sense amplifier 349, amplifier 319 also controls current injectors 301 and 303 to provide the appropriate amount of current to accommodate for the transient current generated by the multiple sense amplifiers coupled to node 304 during a read operation.

Providing a system where the current provided by a current injector to the sense amplifiers is controlled by monitoring the effect of transient current on a voltage of a reference sense amplifier may advantageous provide a system that can adjust the amount of current provided by a current injector to accommodate for changing amounts of transient current. In some systems, the amount of transient current generated by a sense amplifier can vary depending on conditions e.g. such as temperature and operating voltage. Thus, such a system is advantageous over a system where the amount of current provided by the current injector is fixed in that the current injectors can be controlled to provide a precise amount of current needed depending on the operating conditions.

Further, monitoring the effect of a continuously cycled reference sense amplifier in controlling the amount of current provided by a current injector may provide for a more accurate estimate of the amount of current that is needed to be provided, especially if the amount of transient current changes between read cycles. Furthermore, it allows the voltage of amplifier 319 to stabilize prior to being provided control a current injector.

If the current injectors 303 and 301 were controlled based on the voltage of node 304, then such a system would have a lagging response time between the time that the voltage of node 304 decreases (due to transient current) and the time that the control signal voltage can be adjusted to increase the amount of current provided by a current injector. With the system described herein, the amount of current that a current injector needs to supply a node is "predetermined" prior to the read operation and can be supplied during the read operation in a timely manner. Therefore, the voltage of node 304 can be more tightly regulated. It may also allow for a smaller capacitor 335 to be used for voltage regulation.

In the embodiment shown, regulator 123 implements the use of bias followers 315 and 313 in controlling the current provided by current injectors 307, 303, and 301 based on the output of control circuit 318. Bias follower 315 includes current source 343 and transistor 345 and bias follower 313 includes current source 331 and transistor 333. The output of amplifier 319 controls the conductivity of transistors 345 and 333. The voltage of node 311 is controlled by the conductivity of transistor 345 and the voltage of node 305 is controlled by the conductivity of transistor 333. The more conductive transistor 345, the lower the voltage of node 311. Likewise, the more conductive transistor 333, the lower the voltage of node 305.

Using bias followers in controlling the voltage of the control terminals of the current injectors allows for a system to have different values for supply voltages VDDA and VDDR. For example, in one embodiment, VDDA is 3.3 volts and VDDR is 1.2 volts. However, in other embodiments, the output of control circuit 318 may be provided directly to the current injectors. Also, in other embodiments, other types of circuitry may be located between the output of control circuit 318 and the current injector control terminals.

Regulator 123 may have other configurations in other embodiments. For example, in the embodiment shown, Vref equals VDDR. However, the non inverting input of amplifier 321 may be coupled to node 304 through a voltage divider where Vref is less than VDDR. Amplifier 319 may be similarly configured.

Figure 4:
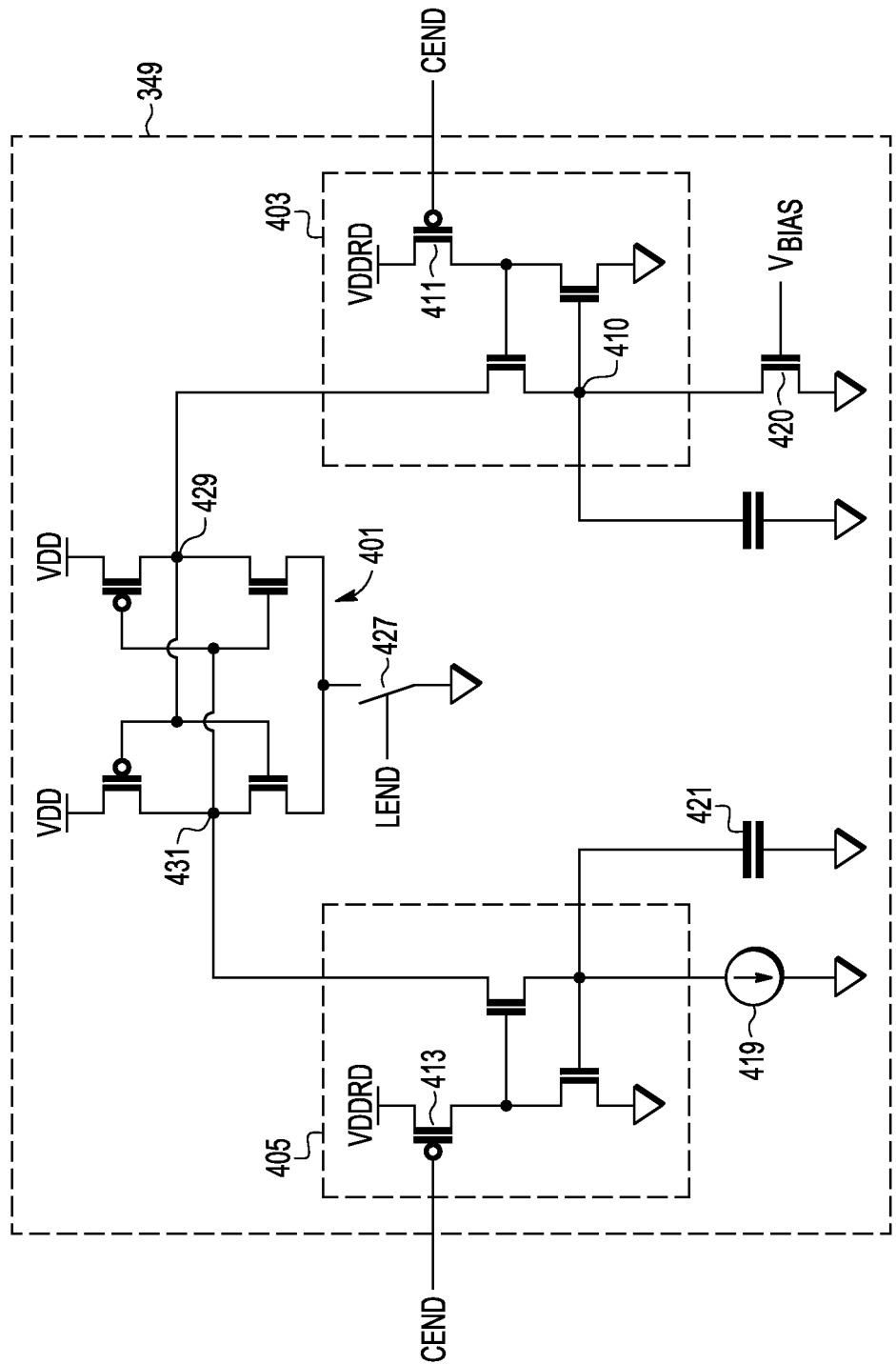
FIG. 4 is a circuit diagram of a reference sense amplifier according to one embodiment of the present invention.

FIG. 4 is a circuit diagram of reference sense amplifier 349. Sense amplifier 349 is similar to sense amplifier 119 of FIG. 2 except that a transistor 420 is coupled to node 410 instead of a memory cell (e.g. cell 106 as in FIG. 2). Also, cascode circuits 405 and 403 both receive a CEND signal (e.g. from controller 113) instead of the CEN signal as received by cascode circuits 205 and 203. Furthermore, switch 427 receives a LEND signal (from controller 113) instead of the LEN signal as received by switch 227. The VDDRD voltage (from node 344) is received by the sources of transistors 413 and 411. Latch 401 is similar to latch 201.

The gate of transistor 420 receives a Vbias signal to control the conductivity of transistor 420. In one embodiment, the Vbias signal is at a low voltage value such that transistor 420 is conductive and latched node 429 is higher than latched node 431. In other embodiments, the Vbias signal is at a high voltage value such that transistor 420 is non conductive and latched node 429 is lower than latched node 431. In another embodiment, parallel devices with their gates connected to VBias can be switched in a manner to modulate the current between a low value and a high value every cycle of the reference sense amplifier to toggle the latched nodes 429 and 431 every cycle.

Figure 5:
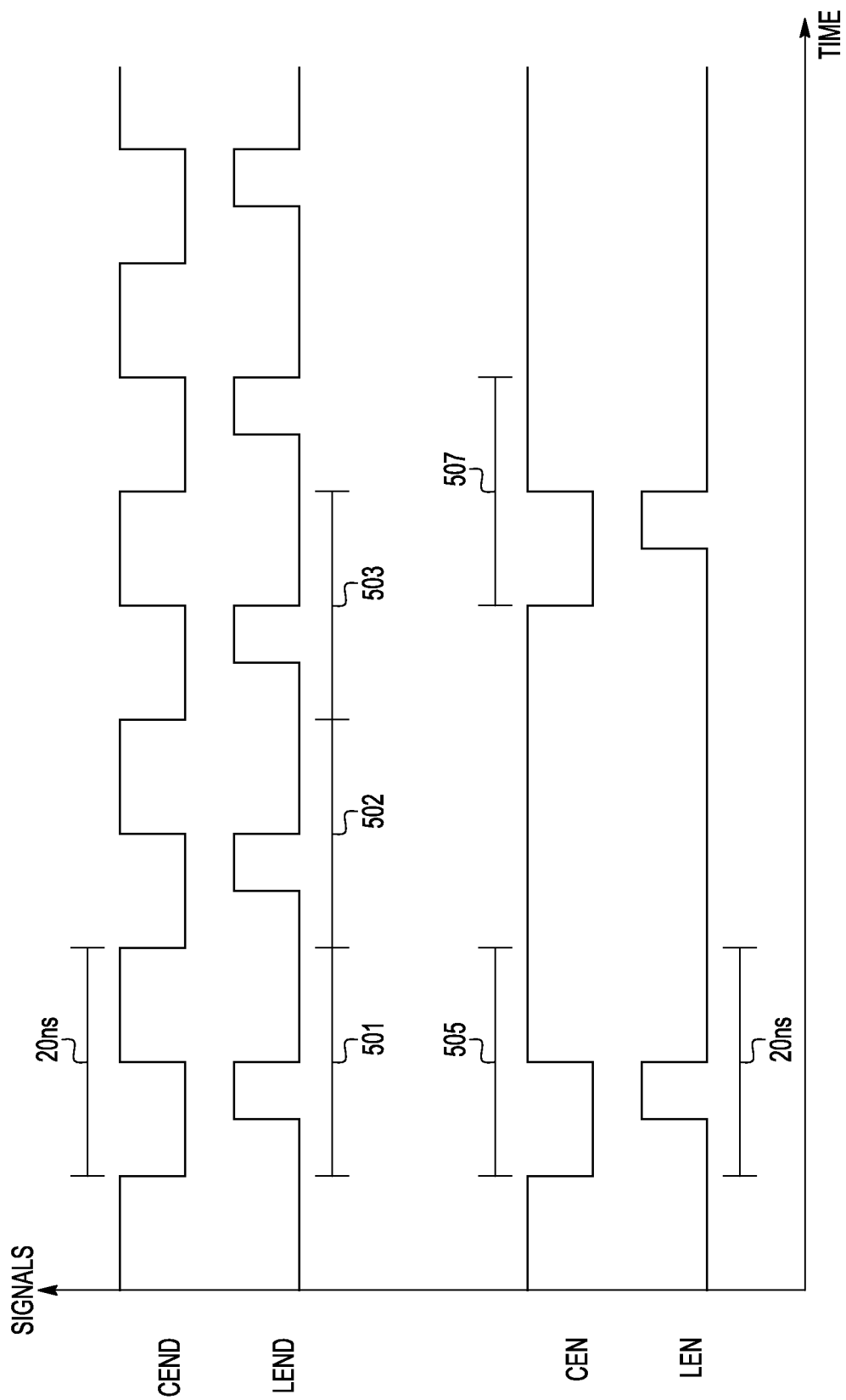
FIG. 5 is timing diagram according to one embodiment of the present invention.

FIG. 5 is a timing diagram of the CEND, LEND, CEN, AND LEN signals during multiple read operations. The CEN and LEN signals are enable signals provided to the sense amplifiers (e.g. 119) for a read operation. FIG. 5 shows two read operations (operation 505 and 507) of memory cells of an array. In the embodiment shown, each read operation takes 20 nanoseconds. Other operations (e.g. a write operation) may be performed between the read operations.

The referenced sense amplifier is continuously switching in a periodic manner. Each cycle of the reference sense amplifier is equal in time to a read cycle (e.g. 20 ns). In the embodiment shown, the reference sense amplifier is toggled by switching the CEND and LEND signals in a periodic manner such that each cycle of the reference sense amplifier immediately follows a preceding cycle. Accordingly, the voltage provided by the output of amplifier 319 is always at a level that accommodates for the transient current, even at times between read cycles of the memory. Thus, the voltage of the output of the current injector control circuit 318 is always at a value to control a current injector to provide an appropriate amount of current to accommodate for transient current generated by a sense amplifier due to a read operation. In some embodiments, the reference sense amplifier is not continuously cycled during low power modes, although in other embodiments, it may be continuously cycled during low power modes.

Figure 6:
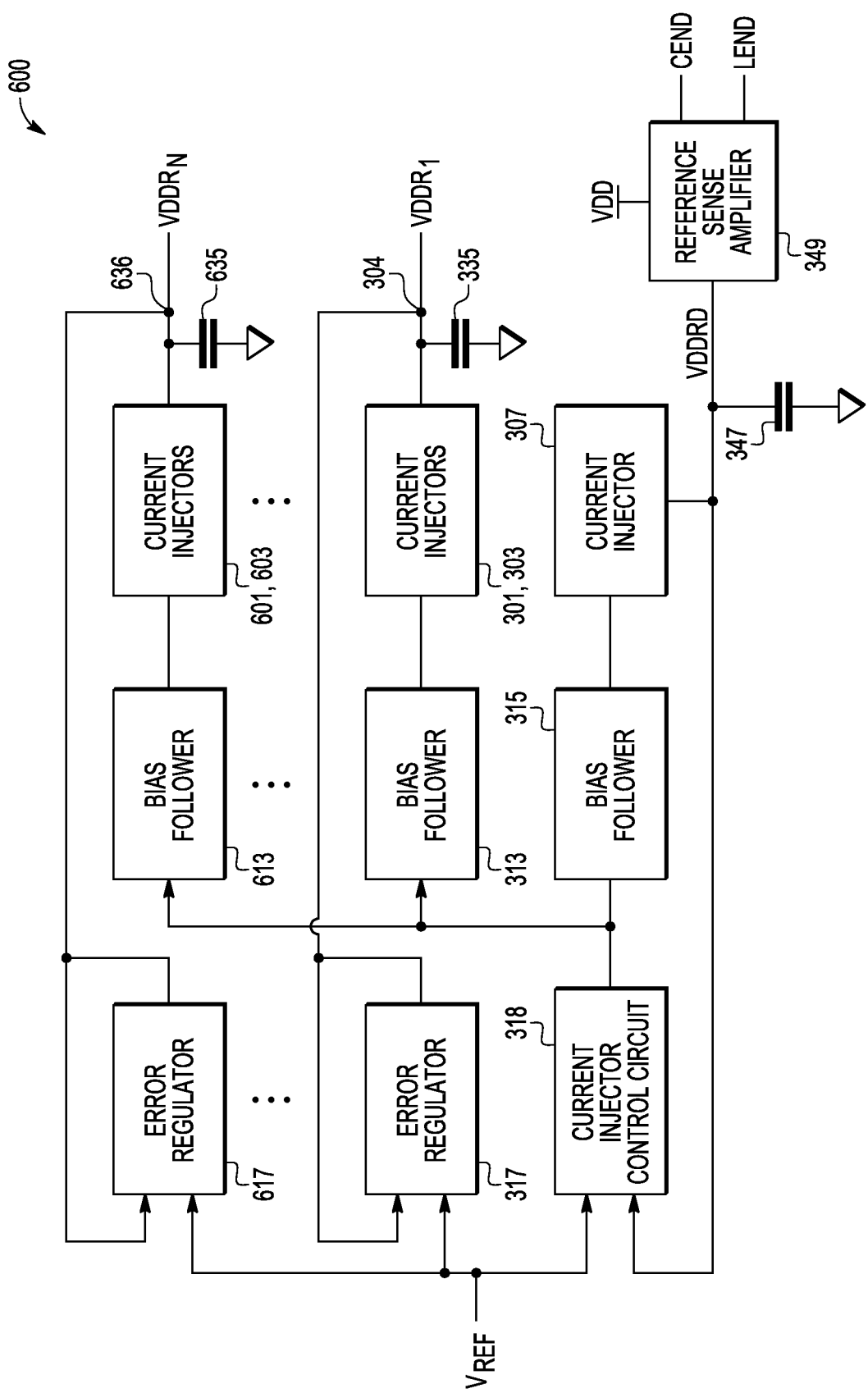
FIG. 6 is a circuit diagram of a voltage regulator according to another embodiment of the present invention.

FIG. 6 is a circuit diagram of a voltage regulator according to another embodiment. Regulator 600 is a modified version of regulator 123 wherein the similar items of FIGS. 6 and 3 have the same numbers. In the embodiment of FIG. 6, Regulator 600 includes an addition error regulator 617 (which is similar to error regulator circuit 317) an additional bias follower 613 (which is similar to bias follower 313) and additional current injectors 601 and 603 which are similar to current injectors 301 and 303, respectively). The additional error regulator 617, bias follower 613, and current injectors 601 and 603 are used to provide an additional regulated voltage (VDDRN) at node 636 that is "noise isolated" from node 304. The amount of current provided by injectors 601 and 603 is controlled by the output of circuit 318 through bias follower 613. Other embodiments may include an additional number of error regulator/bias follower/current injector sets to provide an additional number of noise isolated nodes.

In one embodiment, a memory includes a plurality of memory cells, a plurality of sense amplifiers for reading data from the plurality of memory cells, and a supply voltage regulator. The supply voltage regulator includes a regulator output to provide a regulated voltage to the plurality of sense amplifiers, a current injector to provide current to the regulator output, a reference sense amplifier, and a current injector control circuit which uses a voltage of the reference sense amplifier in controlling an amount of current provided by the current injector to the regulator output.

In another embodiment, a method of operating a memory includes regulating a first regulated voltage based on a reference voltage and based on a second regulated voltage of a reference sense amplifier and providing the first regulated voltage to a plurality of sense amplifiers for a read operation of memory cells.

In another embodiment, a memory includes a plurality of memory cells, a plurality of sense amplifiers for reading data of the plurality of memory cells, and a voltage regulator. The voltage regulator includes a first output to provide a first regulated voltage to the plurality of sense amplifiers for reading data of the plurality of memory cells, a first current injector coupled to the first output to provide current to the first output, and a reference sense amplifier. The voltage regulator includes a second output to provide a second regulated voltage to the reference sense amplifier, a second current injector coupled to the second output to provide current to the second output, and a current injector control circuit that uses the second regulated voltage and a reference voltage to control an amount of current provided by the first current injector to the first output and an amount of current provided by the second current injector to the second output.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A memory comprising:
   a plurality of memory cells;
   a plurality of sense amplifiers for reading data from the plurality of memory cells;
   a supply voltage regulator including:
      a regulator output to provide a regulated voltage to the plurality of sense amplifiers,
      a current injector to provide current to the regulator output;
      a reference sense amplifier;
      a current injector control circuit which uses a voltage of the reference sense amplifier in controlling an amount of current provided by the current injector to the regulator output.

2. The memory of claim 1 wherein the current injector control circuit comprises:
   an amplifier including a first input coupled to receive a voltage indicative of a reference voltage and a second input coupled to a node that produces the voltage of the reference sense amplifier, wherein an output of the amplifier controls the amount of current provided by the current injector to the regulator output.

3. The memory of claim 1 wherein the supply voltage regulator includes a second current injector coupled to a second node that provides the voltage of the reference sense amplifier, wherein an output of the current injector control circuit controls the amount of current provided by the current injector to the regulator output and controls the amount of current provided by the second current injector to the second node.

4. The memory of claim 3 wherein the voltage of the output of the current injector control circuit is dependent upon a difference in voltage of the second node and a reference voltage.

5. The memory of claim 4 wherein during an operation of the memory, the sense amplifier is continuously cycling and drawing transient current from the second node, wherein the output of the current injector control circuit is provided at a voltage to control the second current injector to provide current to the second node so that a voltage of the second node matches a voltage indicated by the reference voltage.

6. The memory of claim 3 wherein:
   the current injector is part of a set of at least one current injector that is used for providing the regulated voltage at the regulator output to the plurality of sense amplifiers for a read operation;
   wherein the current injector control circuit controls the amount of current provided by the set during a read operation;

wherein M is the number of the plurality of sense amplifiers;

wherein a current potential of the set is M times a current potential of the second current injector.

7. The memory of claim 1 wherein the supply voltage regulator further comprises:
a bias follower having a first node coupled to an output of the current injector control circuit and a second node coupled to a control terminal of the current injector, wherein the control terminal of the current injector receives a voltage provided by the bias follower to control the amount of current provide by the current injector.

8. The memory of claim 1 wherein the output of the supply voltage regulator is coupled to a cascode circuit of each of the plurality of sense amplifiers during a read operation performed using the plurality of sense amplifiers.

9. The memory of claim 8, wherein the voltage of the reference sense amplifier is a supply voltage provided to a cascode circuit of the reference sense amplifier.

10. The memory of claim 1 wherein the supply voltage regulator includes an error regulator circuit to regulate the voltage of the regulator output to match a voltage indicated by the reference voltage.

11. The memory of claim 1 wherein current injector comprises:
a first terminal connected to a power supply rail;
a second terminal connected to the regulator output;
a control terminal to receive a signal that controls the amount of current provided by the current injector from the power supply rail to the regulator output.

12. The memory of claim 1 wherein:
the supply voltage regulator includes a second regulator output to provide a second regulated supply voltage;
a second current injector to provide current to the second regulator output;
wherein the current injector control circuit uses the voltage of the reference sense amplifier in controlling an amount of current provided by the second current injector to the second regulator output.

13. A method of operating a memory comprising:
regulating a first regulated voltage based on a reference voltage and based on a second regulated voltage of a reference sense amplifier; and
providing the first regulated voltage to a plurality of sense amplifiers for a read operation of memory cells.

14. The method of claim 13 wherein the regulating the first regulated voltage is based on
a difference between the reference voltage and the second regulated voltage.

15. The method of claim 13 wherein the providing the first regulated voltage to the plurality of sense amplifiers includes providing the first regulated voltage to cascode circuits of the plurality of sense amplifiers.

16. The method of claim 13 wherein the providing includes providing the first regulated voltage via an output node of a voltage regulator, the regulating includes controlling an amount of current provided by a current injector to the output node based on the reference voltage and based on the second regulated voltage of the reference sense amplifier.

17. The method of claim 16 further comprising:
regulating the second regulated voltage based on the reference voltage and based on the second regulated voltage of the reference sense amplifier.

18. The method of claim 17 wherein the regulating the second regulated voltage includes controlling an amount of current provided by a second current injector coupled to a node that provides the second regulated voltage to the reference sense amplifier, wherein the amount of current provided by the second current injector is based on the reference voltage and based on the second regulated voltage of the reference sense amplifier.

19. The method of claim 18 wherein an amplifier receives a first voltage indicative of the reference voltage and a second voltage indicative of the second regulated voltage, wherein the regulating the first regulated voltage and the regulating the second regulated voltage includes the amplifier providing an output voltage that controls the amount of current provided by first current injector and controls the amount of current provided by the second current injector.

20. A memory comprising:
a plurality of memory cells;
a plurality of sense amplifiers for reading data of the plurality of memory cells;
a voltage regulator, comprising:
a first output to provide a first regulated voltage to the plurality of sense amplifiers for reading data of the plurality of memory cells;
a first current injector coupled to the first output to provide current to the first output;
a reference sense amplifier;
a second output to provide a second regulated voltage to the reference sense amplifier;
a second current injector coupled to the second output to provide current to the second output;
a current injector control circuit that uses the second regulated voltage and a reference voltage to control an amount of current provided by the first current injector to the first output and an amount of current provided by the second current injector to the second output.

21. The memory of claim 20 wherein the current injector control circuit includes an amplifier, including a first input coupled to receive a first voltage indicative of the reference voltage and a second input to receive a second voltage indicative of the second regulated voltage, wherein an output of the amplifier controls the amount of current provided by the first current injector to the first output and the amount of current provided by the second current injector to the second output.

* * * * *